(12) United States Patent
Shibata et al.

(10) Patent No.: US 6,709,703 B2
(45) Date of Patent: Mar. 23, 2004

(54) METHOD FOR FABRICATING A III-V NITRIDE FILM AND AN APPARATUS FOR FABRICATING THE SAME

(75) Inventors: Tomohiko Shibata, Kasugai (JP); Yukinori Nakamura, Nagoya (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 162 days.

(21) Appl. No.: 10/010,945

(22) Filed: Dec. 6, 2001

(65) Prior Publication Data

US 2002/0124965 A1 Sep. 12, 2002

(30) Foreign Application Priority Data

Dec. 12, 2000 (JP) .......................................... 2000-377547
Nov. 6, 2001 (JP) .......................................... 2001-340945

(51) Int. Cl.[7] .............................................. C23C 16/34
(52) U.S. Cl. ............................ 427/255.34; 427/255.38; 427/255.394; 117/88; 117/104
(58) Field of Search ....................... 427/255.34, 255.38, 427/255.354; 117/88, 184

(56) References Cited

U.S. PATENT DOCUMENTS 4,047,496 A * 9/1977 McNeilly et al. ............ 118/725
6,218,280 B1 * 4/2001 Kryliouk et al. ............ 438/607

* cited by examiner

*Primary Examiner*—Timothy Meeks
(74) *Attorney, Agent, or Firm*—Burr & Brown

(57) ABSTRACT

A substrate is set on a susceptor installed in a reactor and arranged horizontally. A cooling jacket is provided at a portion of the inner wall of the reactor that is opposite to the substrate. By flowing a given cooling medium through the cooling jacket with a pump connected to the jacket, at least the opposite portion of the inner wall is cooled down, which inhibits the reaction between raw material gases introduced into the reactor. As a result, in fabricating a III-V nitride film, the film growth rate is developed and the crystal quality is developed.

6 Claims, 5 Drawing Sheets

METHOD FOR FABRICATING A III-V NITRIDE FILM AND AN APPARATUS FOR FABRICATING THE SAME

BACKGROUND OF THE INVENTION

1. Field of the Invention

This invention relates to a method to epitaxially grow a III-V nitride film, particularly $Al_xGa_yIn_zN$ (x+y+z=1) film on a given substrate using a Metal Organic Chemical Vapor Deposition (MOCVD) method and an apparatus for the same method.

2. Related Art Statement

In opto-electronic devices such as light-emitting diodes, laser diodes or photodiodes, it is proposed that III-V nitride films having their compositions of $Al_xGa_yIn_zN(X+Y+Z=1)$ are epitaxially grown on a given substrate made of sapphire single crystal, for example. Up to now, the epitaxial growth of the $Al_xGa_yIn_zN$ film has been performed using a MOCVD method or recently, a Hydride Vapor Phase Epitaxy (HVPE) method.

In the case of making a GaN film using a HVPE method, first of all, a substrate made of sapphire single crystal is set into a reactor in which a gallium metallic material is charged. Then, a hydrochloric acid gas is introduced into the reactor and reacted with the gallium metallic material, to generate a hydrochloric gallium gas. Then, an ammonia gas is introduced into the reactor and reacted with the hydrochloric gallium gas, to deposit and fabricate the GaN film on the substrate. The HVPE method has a higher film growth rate than a MOCVD method or a MOVPE method. For example, in the MOVPE method, a GaN film can be epitaxially grown typically at only several $\mu$m/hour, but in the HVPE method, the GaN film can be epitaxially grown typically at several hundreds $\mu$m/hour. Therefore, the HVPE method has its advantage in forming a thicker III-V nitride film.

However, a good quality $Al_xGa_yIn_zN$ film can not be provided by the HVPE method, and the fluctuation in thickness on the same substrate may be increased. On the other hand, forming the $Al_xGa_yIn_zN$ film via the MOVPE method, is a time consuming process and thus, the fabrication cost of the $Al_xGa_yIn_zN$ film is relatively high.

In the case of making an $Al_xGa_yIn_zN$ (x+y+z=1) film using a MOCVD method, a given substrate is set and held on a susceptor installed in a reactor, and is heated to a predetermined temperature by a heater. Then, a trimethylaluminun gas, a trimethylgallium gas, a trimethylindium gas or the like as III raw material gases are introduced with a carrier gas composed of a hydrogen gas or a nitrogen gas into the reactor. An ammonia gas as a V raw material gas is introduced with a carrier gas composed of a hydrogen gas or a nitrogen gas into the reactor. Then, the III raw material gases and the V raw material gas are reacted, to deposit and form the $Al_xGa_yIn_zN$ film on the substrate. As the $Al_xGa_yIn_zN$ film, an aluminum nitride film, a gallium nitride film, an indium nitride film, an aluminum-gallium nitride film, an aluminum-indium nitride film and a gallium-indium nitride film are exemplified.

In the above conventional method such as a MOCVD method, if the reaction between the III raw material gases and the V raw material gas is created on the wall surfaces of the reactor, the film-forming efficiency is degraded, and thus, the film growth rate is decreased. In the past, therefore, although it is considered that a cooling jacket is attached to the reactor, it is very difficult to directly attach the cooling jacket to the reactor because the reactor is made of quartz into a complicated figuration. As a result, the reactor is covered with a stainless tube on which a cooling jacket is attached.

In such a conventional fabricating apparatus, since the reactor is only indirectly cooled by the cooling jacket, it can not be cooled down sufficiently. Particularly, it was confirmed that an AlN film or an Al-rich $Al_xGa_yIn_zN$ (x+y+z=1, x>0.5, y$\geq$0, Z$\geq$0) film can not be fabricated sufficiently, as compared with a GaN film or an Al-poor $Al_xGa_yIn_zN$ (x+y+z=1, 0$\leq$x<0.5, y$\geq$0, Z$\geq$0) film. The reason is because in fabricating such an Al-rich $Al_xGa_yIn_zN$ film, a large amount of trimethylaluminum and a large amount of ammonia are employed as raw material gases and thus, the large proportions of the raw material gases are reacted on the wall of the reactor and on the susceptor heated to a higher temperature. As a result, the epitaxial growth of the Al-rich $Al_xGa_yIn_zN$ (x+y+z=1, x>0.5, y$\geq$0, Z$\geq$0) film is inhibited.

Particularly, in the case that the susceptor is set on the bottom wall of the reactor and the substrate is set on the susceptor so that the main surface of the substrate is faced to the top wall of the reactor, a large amount of aluminum nitrides may be deposited on the top wall because the top wall is easy to be heated to a high temperature due to the radiant heat from the susceptor. Since the aluminum nitrides may be broken away from on the top wall and introduced into the growing Al-rich $Al_xGa_yIn_zN$ film, the crystal quality of the Al-rich $Al_xGa_yIn_zN$ film may be deteriorated.

In light of the above-mentioned problems, such a technique as to cool down the raw material gases with the cooling jackets attached to the nozzles to introduce the raw material gases into the reactor is disclosed in the Japanese Laid-open Publications Kokai Hei 10-167883 (JP A 10-167883) and Kokai Hei 10-67884 (JP A 10-67884). Moreover, such a technique as to cool down the raw material gases around the susceptor with a cooling jacket provided on the upper side from the susceptor is disclosed in the Japanese Laid-open Publication Kokai Hei 10-100726 (JP A 10-100726).

According to such a conventional technique, although the film growth rate and the crystal quality of the Al-rich $Al_xGa_yIn_zN$ film can be improved to some degree, they are not sufficient. Particularly, since the portion of the top wall of the reactor opposing to the substrate on the susceptor is not cooled down sufficiently, the broken away aluminum nitrides may deteriorate the crystal quality of the Al-rich $Al_xGa_yIn_zN$ film to large degree.

In addition, when using the conventional technique, the fluctuation in thickness of the $Al_xGa_yIn_zN$ film is increased. Particularly, when employing a larger substrate such as a 3-inch wafer, the fluctuation in thickness becomes conspicuous.

Moreover, it is proposed that a vertical reactor tube is employed and a substrate is set vertically in the reactor tube, that is, substantially parallel to the wall of the reactor tube. In this case, although raw material gases are introduced into the reactor tube from the top via nozzles cooled down with a cooling jacket, the nozzles may be stopped up through the reaction between the raw material gases in the nozzles.

SUMMARY OF THE INVENTION

It is an object of the present invention to work out the above conventional problems, and thus, to provide a method for epitaxially growing a good quality $Al_xGa_yIn_zN$ (x+y+z=1, x$\geq$0, y$\geq$0, Z$\geq$0)film at a higher film growth rate without the fluctuation in thickness using a MOCVD method.

It is another object of the present invention to provide an apparatus for epitaxially growing a good quality AlxGayInzN (x+y+z=1, x≧0, y≧0, Z≧0) film at a higher film growth rate without the fluctuation in thickness via a MOCVD method.

In order to achieve the above object, this invention relates to a method for fabricating a III-V nitride film, including the steps of preparing a reactor horizontally, setting a substrate onto a susceptor installed in the reactor, heating the substrate to a predetermined temperature, directly cooling at least the portion of the inner wall of the reactor opposite to the substrate, and introducing a III raw material gas and a V raw material gas with a carrier gas onto the substrate, and thus, fabricating a III-V nitride film by a MOCVD method.

The effect of the present invention can be exhibited in the case that in forming the III-V nitride film, the susceptor is set on the bottom wall of the reactor so as to oppose the top wall of the reactor, and the substrate is set on the susceptor so that the main surface of the substrate is opposed to the top wall of the reactor. However, the susceptor may be set on the top wall of the reactor, and the substrate is set on the susceptor so that the main surface of the substrate is opposed to the bottom wall of the reactor.

According to the present invention, a large amount of trimethylaluminum and a large amount of ammonia are introduced into the reactor as raw material gases, to be able to fabricate an Al-rich AlGaInN (x+y+z=1, x>0.5, y≧0, Z≧0) film or an AlN film in good quality at a higher film growth rate by a MOCVD method.

In the present invention, the substrate may be made of oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as $ZrB_2$. Moreover, the substrate may be made of an epitaxial substrate composed of a base material made of the above-mentioned single crystal and an epitaxial film made of oxide single crystal such as ZnO single crystal or MgO single crystal, IV single crystal or IV-IV single crystal such as Si single crystal or SiC single crystal, III-V single crystal such as GaAs single crystal, InP single crystal, AlN single crystal, GaN single crystal or AlGaN single crystal, and boride single crystal such as $ZrB_2$.

This invention also relates to an apparatus for fabricating a III-V nitride film using a MOCVD method, including a reactor prepared horizontally, a susceptor to hold a substrate thereon installed in the reactor, a heater to heat the substrate to a predetermined temperature via the susceptor, and a cooling means to directly cool down at least the portion of the inner wall of the reactor opposite to the substrate.

In a preferred embodiment of the fabricating apparatus of the present invention, the portions of the inner wall of the reactor opposite to the susceptor and in the upper stream from the substrate of the raw material gases are cooled down with the cooling means. In this case, two cooling jackets may be prepared for the portions opposite to the susceptor and in the upper stream from the substrate. The cooling jacket may be made of stainless steel. As a result, the configuration of the apparatus is simplified, and thus, the cost of the apparatus can be lowered In another preferred embodiment of the fabricating apparatus of the present invention, the cooling means includes a cooling jacket directly attached to or built in the inner wall of the reactor, a pump to circulate a cooling medium through the cooling jacket and a cooling medium temperature-controlling instrument. As the cooling medium, water may be exemplified.

In still another preferred embodiment of the fabricating apparatus of the present invention, the reactor with the cooling means is covered with a housing entirely, and another cooling means is provided on the outer side of the housing. In this case, the whole of the reactor can be cooled down effectively.

In a further preferred embodiment of the fabricating apparatus of the present invention, the reactor is made of stainless steel entirely, and the whole of the reactor is cooled down directly with the cooling means. In this case, the configuration of the reactor can be simplified, and thus, the fabricating cost of a III-V nitride film can be reduced.

BRIEF DESCRIPTION OF THE DRAWINGS

For better understanding of the present invention, reference is made to the attached drawings, wherein.

DETAILED DESCRIPTION OF THE INVENTION

Figure 1:
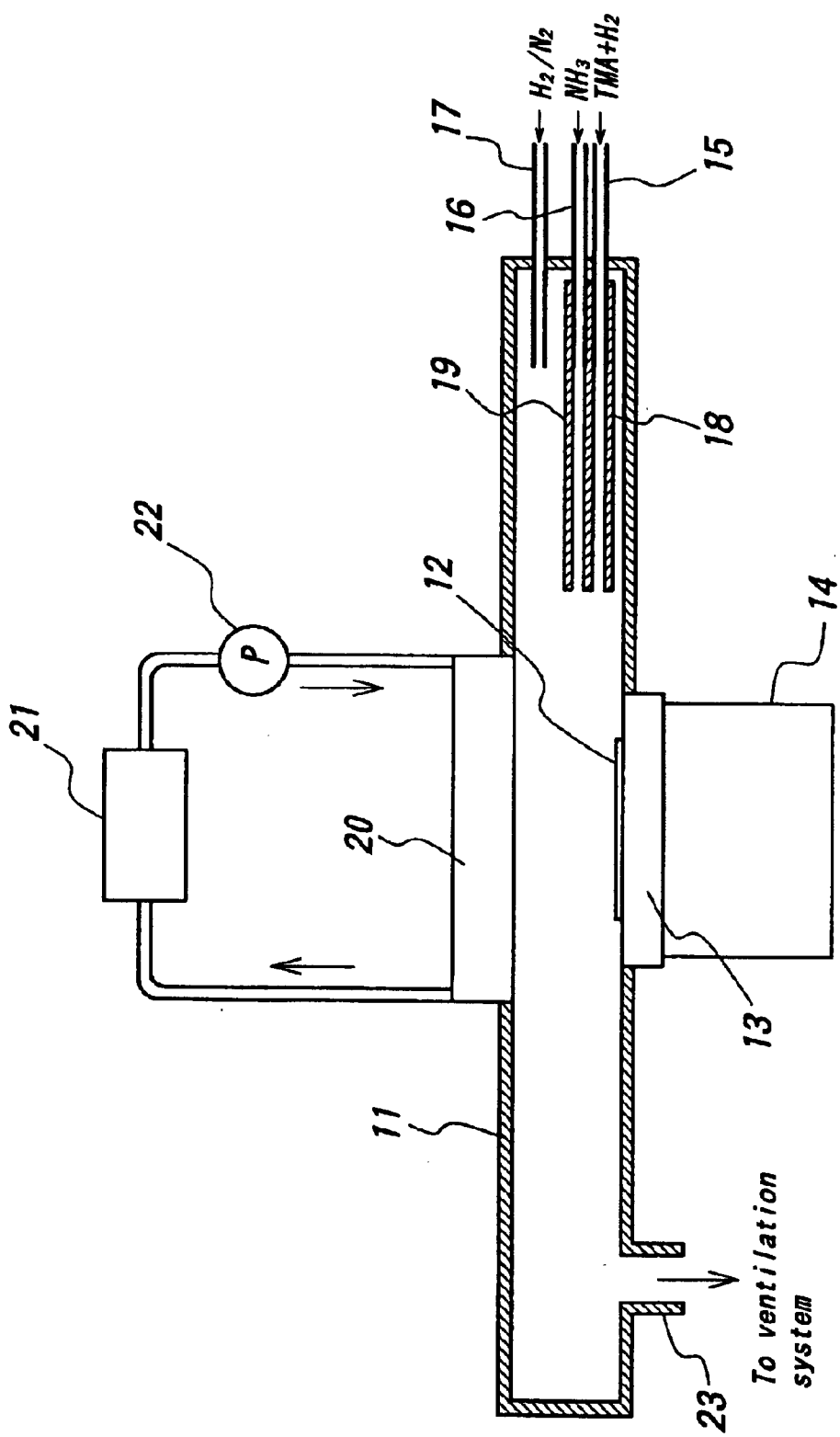
FIG. 1 is a cross sectional view schematically showing a first embodiment of the fabricating apparatus of the present invention.

FIG. 1 is a cross sectional view schematically showing a first embodiment of the fabricating apparatus of the present invention. In this embodiment, an AlN film is formed on a sapphire single crystal substrate. The fabricating apparatus depicted in FIG. 1 includes a reactor 11 set horizontally and made of quartz entirely, and a susceptor 13 substantially located at the almost center of the bottom wall of the reactor 11. Then, a heater 14 is provided under the susceptor 13. A sapphire single crystal substrate 12 is set and held on the susceptor 13 upwardly, and heated with the heater 14 to a given temperature via the susceptor 13. The susceptor 13 can also be disposed on the top wall of the reactor 11, in which case the substrate 12 is set and held on the susceptor downwardly.

At the right side of the reactor 11 are provided gas inlets 15–17 to introduce raw material gases with a carrier gas. In the case of making an AlN film, a trimethylaluminum gas is introduced with a hydrogen carrier gas from the first gas inlet 15, and an ammonia gas is introduced from the second gas inlet 16. Then, a carrier gas composed of a hydrogen gas and a nitrogen gas is introduced from the third gas inlet 17. The introduced trimethylaluminum gas and the introduced ammonia gas are also introduced into the center region of the reactor through separated guiding tubes 18 and 19, respectively. In this case, the raw material gases are effectively supplied onto the substrate 12, and not supplied in the remote region from the substrate 12. Therefore, the introduced raw material gases are consumed by a MOCVD reaction on the substrate.

Then, a cooling jacket 20 made of stainless steel is provided at the outer side of the top wall of the reactor opposite to the substrate 12. A first cooling medium temperature-controlling instrument 21 and a pump 22 are connected to the cooling jacket 20, and thus, a given cooling medium is flown through the cooling jacket 20 with the pump 22. The temperature of the cooling medium is controlled with the controlling instrument 21. Moreover, at the left side of the reactor 11 is provided a ventilation duct 23, and the remaining raw material gases not consumed are exhausted from the ventilation duct 23.

The substrate 12 is heated to around 1000° C., for example by the heater 14, and the interior temperature and the inner wall temperature of the reactor 11 to which the raw material gases are directly contacted are cooled down by flowing the cooling medium through the cooling jacket 20. Particularly, the center of the top wall opposite to the substrate 12 is cooled down effectively. Therefore, the reaction between the raw material gases can be reduced effectively on the inner wall, particularly on the center of the inner top wall, and can be enhanced on the substrate 12. As a result, an AlN film can be formed at a higher film growth rate, and the crystal quality of the AlN film can be developed through the inhibition of the deposition and thus, the breakaway of the aluminum nitride on or from the inner wall of the reactor.

Figure 2:
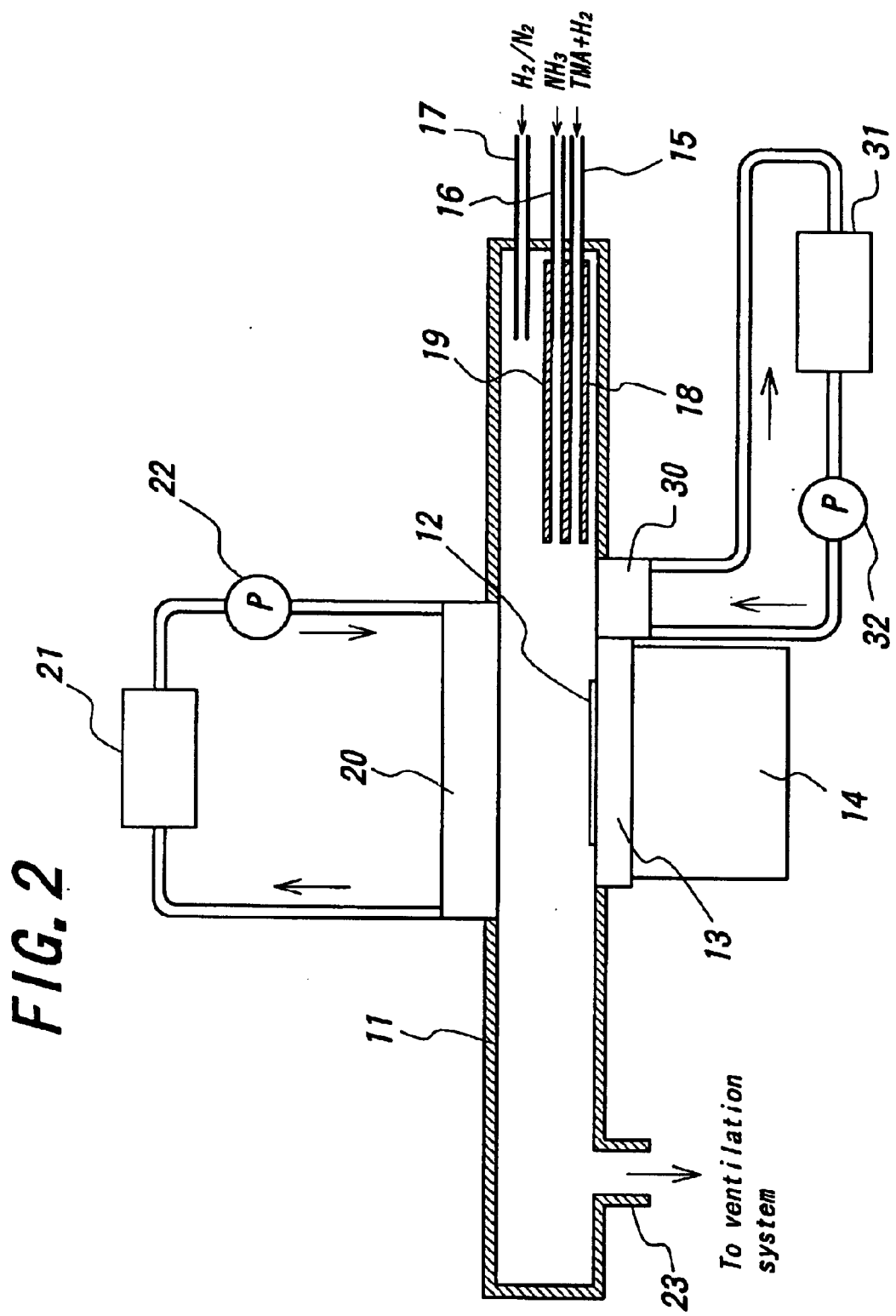
FIG. 2 is a cross sectional view schematically showing a second embodiment of the fabricating apparatus of the present invention.

FIG. 2 is a cross sectional view schematically showing a second embodiment of the fabricating apparatus of the present invention. The same reference numerals are given to the similar constituent portions to the ones depicted in FIG. 1. In this embodiment, similar to embodiment one discussed above, the fabricating apparatus depicted in FIG. 2 includes a reactor 11 set horizontally and made of quartz entirely, and a susceptor 13 located at the substantially almost center of the bottom wall of the reactor 11. Then, a heater 14 is provided under the susceptor 13. A sapphire single crystal substrate 12 is set and held on the susceptor 13 upwardly, and heated with the heater 14 to a given temperature via the susceptor 13. Moreover a cooling jacket 20 made of stainless steel and having a first cooling medium temperature-controlling instrument 21 and a pump 22 is provided at the outer side of the top wall of the reactor opposite to the substrate 12.

At the right side of the reactor 11 are provided gas inlets 15–17 to introduce raw material gases with a carrier gas. A trimethylaluminum gas is introduced with a hydrogen carrier gas from the first gas inlet 15, and an ammonia gas is introduced from the second gas inlet 16. Then, a carrier gas composed of a hydrogen gas and a nitrogen gas is introduced from the third gas inlet 17. The introduced trimethylaluminum gas and the introduced ammonia gas are also introduced into the center region of the reactor through separated guiding tubes 18 and 19, respectively. In this case, too, the raw material gases are effectively supplied onto the substrate 12, and not supplied in the remote region from the substrate 12. Therefore, the introduced raw material gases are consumed by a MOCVD reaction on the substrate.

In this embodiment, for cooling the upper stream side of the reactor 11, a second cooling jacket 30 is provided at the upper stream side. To the second cooling jacket 30 are connected a second cooling medium temperature-controlling instrument 31 and a pump 32. Then, a given cooling medium is flown through the cooling jacket 30 with the pump 32, as well as the first cooling jacket 20. The first and the second cooling jackets 20 and 30 may be combined and composed of a single cooling jacket.

In this embodiment, by flowing a given cooling medium through the first and the second cooling jackets 20 and 30, the interior temperature and the inner wall temperature of the reactor 11 to which the raw material gases are directly contacted are cooled down. Particularly, the center of the top wall opposite to the substrate 12 and the upper stream side of the reactor 11 are cooled down effectively. As a result, an AlN film can be formed at a much higher film growth rate, and the crystal quality of the AlN film can be more developed through the inhibition of the deposition and thus, the breakaway of the aluminum nitride on or from the inner wall of the reactor.

Figure 3:
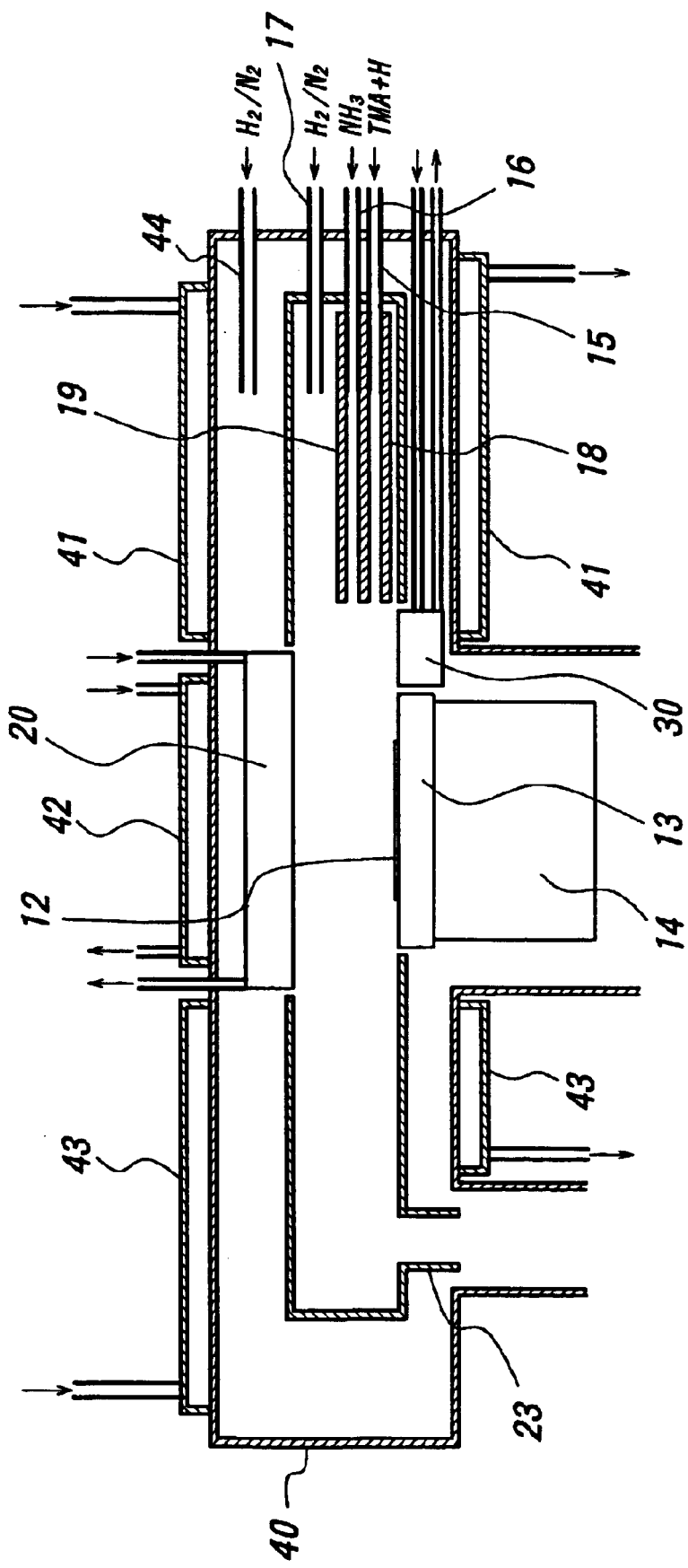
FIG. 3 is a cross sectional view schematically showing a third embodiment of the fabricating apparatus of the present invention.

FIG. 3 is a cross sectional view schematically showing a third embodiment of the fabricating apparatus of the present invention. The same reference numerals are given to the similar constituent portions to the ones depicted in FIGS. 1 and 2, and detailed explanations for the similar constituent portions are omitted.

In this embodiment, the reactor 11 is covered with a housing 40 made of quartz almost entirely. Outside of the housing 40 are provided a third cooling jacket 41 so as to cover the gas inlets 15–17, a fourth cooling jacket 42 at the center of the reactor 11 and a fifth cooling jacket 43 so as to cover the ventilation duct 23. To the cooling jackets 41–43 are connected their respective cooling medium temperature-controlling means and pumps not shown. A given cooling medium is flown through the cooling jackets 41–43 in the directions designated by the arrows, In between the reactor 11 and the housing 40 is a carrier gas composed of a hydrogen gas and a nitrogen gas from a gas inlet 44.

Figure 4:
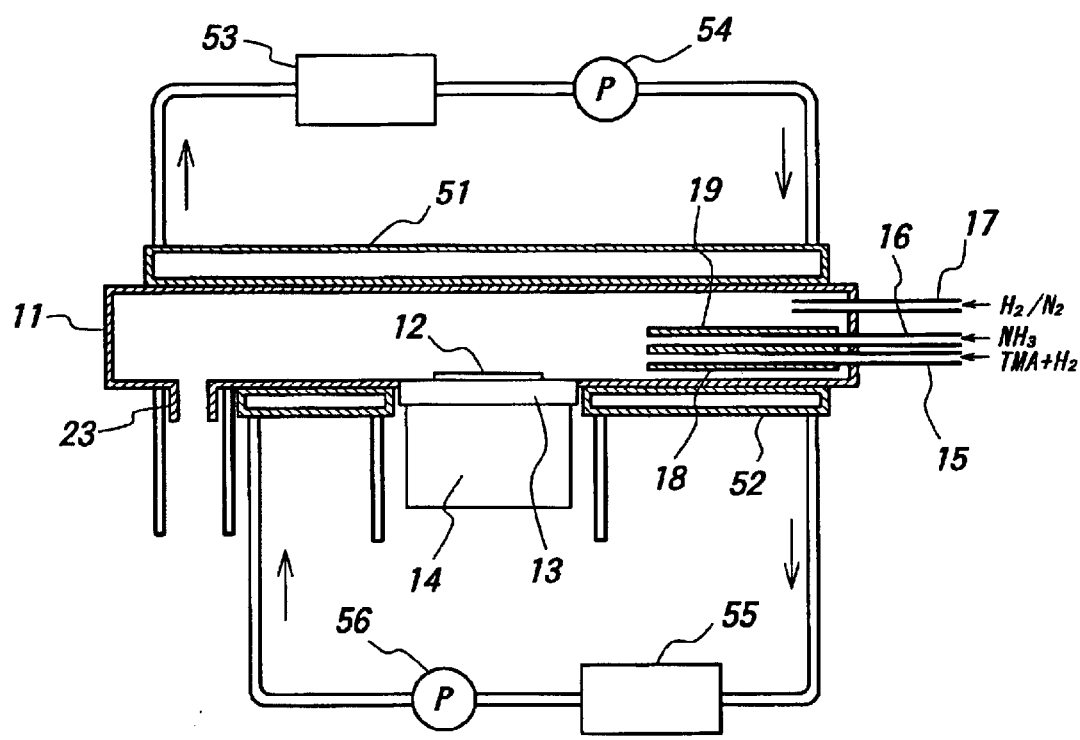
FIG. 4 is a cross sectional view schematically showing a fourth embodiment of the fabricating apparatus of the present invention.

FIG. 4 is a cross sectional view schematically showing a fourth embodiment of the fabricating apparatus of the present invention. The same reference numerals are given to the similar constituent portions to the ones depicted in FIGS. 1–3. In this embodiment, a cooling jacket 51 is provided on the top wall of the reactor entirely, and a second cooling jacket 52 is provided in the bottom wall of the reactor entirely except the susceptor 13 and the heater 14.

To the first cooling jacket 51 are connected a first cooling medium temperature-controlling instrument 53 and a first pump 54, and to the second cooling jacket 52 are connected a second cooling medium temperature-controlling instrument 55 and a second pump 56. Then, the gas inlets 15–17 are provided at the right side of the reactor 11, and the ventilation duct 23 is provided at the left side of the reactor 11, as well as FIGS. 1–3.

Figure 5:
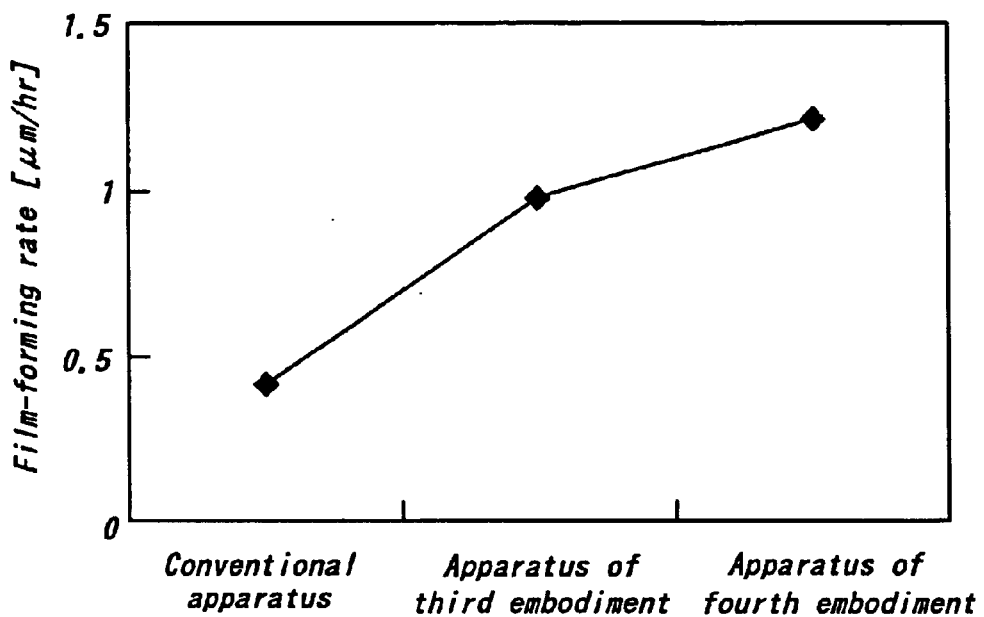
FIG. 5 is a graph showing a film growth rate of a III-V nitride film in using a fabricating apparatus according to the present invention, in comparison with the one using a conventional fabricating apparatus.

FIG. 5 is a graph showing film growth rates of AlN films fabricated by using the fabricating apparatuses in the third and the fourth embodiments shown in FIGS. 3 and 4, respectively, in comparison with the ones fabricated by using a conventional fabricating apparatus. In this case, the same condition is employed. In the case of using the conventional apparatus, the film growth rate was only 0.5 $\mu$m/hr. On the other hand, in the case of using the apparatus of the third embodiment in which the upper stream side of the reactor is particularly cooled down, the film-forming rate is developed to about 1 $\mu$m/hr. Moreover, in the case of using the apparatus of the fourth embodiment in which the whole of the reactor is almost cooled down, the film growth rate is developed to about 1.2 $\mu$m. As a result, it is turned out that the film-forming efficiency can be enhanced according to the present invention.

Figure 6:
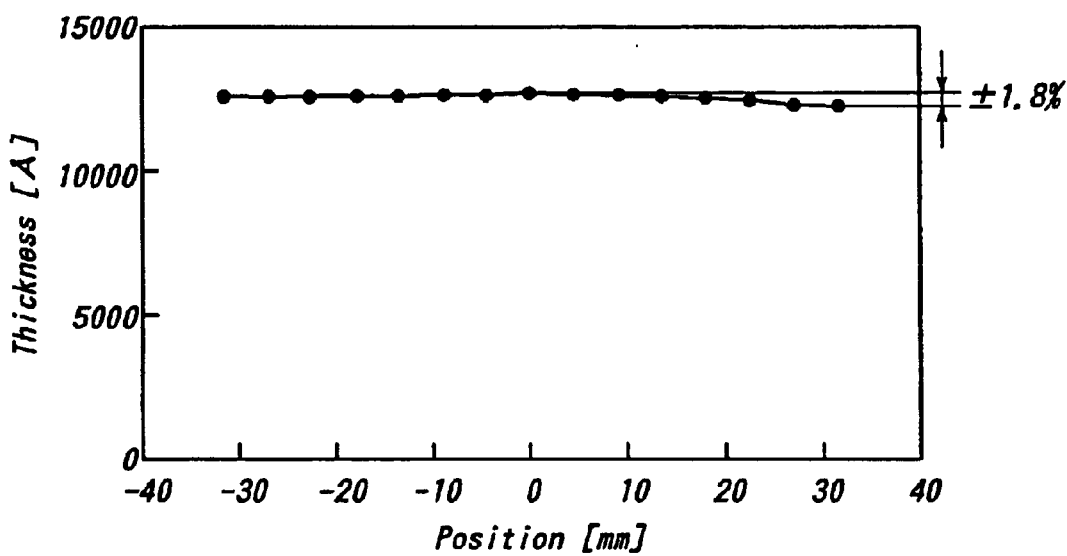
FIG. 6 is a graph showing a distribution in thickness of a III-V nitride film on a 3-inch wafer in using a fabricating apparatus according to the present invention.

FIG. 6 is a graph showing a distribution in thickness of an AlN film fabricated on a 3-inch wafer by using the apparatus of the fourth embodiment shown in FIG. 4. The zero point of the abscissa axis designates the center of the wafer, and thus, the abscissa itself designates the distance of the center on the wafer. The vertical axis designates the thickness of the AlN film in order of angstrom. As is apparent from FIG. 6, the distribution in thickness on the 3-inch wafer is repressed within 1.8%, and thus, it is turned out that the AlN film can be formed uniformly on such a larger substrate by using the apparatus of the present invention.

Although the present invention was described in detail with reference to the above example, this invention is not limited to the above disclosure and every kind of variation and modification may be made without departing from the scope of the present invention. Instead of such an AlN film, an Al-rich Al$_x$Ga$_y$In$_z$N (x+y+z=1, x>0.5, y≧0, Z≧0) film may be fabricated. Besides, an Al-poor Al$_x$Ga$_y$In$_z$N (x+y+z=1, 0≦x<0.5, y≧0, Z≧0) film may be fabricated. Moreover, instead of sapphire single crystal, the substrate 12 may be made of oxide single crystal such as ZnO single crystal, LiAlO$_2$ single crystal, LiGaO$_2$ single crystal, MgAl$_2$O$_4$ single crystal, or MgO single crystal, IV single crystal or IV-IV single crystal such as Si single crystal or SiC single crystal, III-V single crystal such as GaAs single crystal, AlN single crystal, GaN single crystal or AlGaN single crystal, and boride single crystal such as ZrB$_2$. In addition, the substrate may be made of an epitaxial substrate composed of a base material made of the above-mentioned single crystal and an epitaxial film made of oxide single crystal such as ZnO single crystal or MgO single crystal, IV single crystal or IV-IV single crystal such as Si single crystal or SiC single crystal, III-V single crystal such as GaAs single crystal, InP single crystal, AlN single crystal, GaN single crystal or AlGaN single crystal, and boride single crystal such as ZrB$_2$.

In the above-mentioned fourth embodiment, although the cooling jackets 51 and 52 made of stainless steel are provided on the outer side of the reactor 11, the reactor 11 itself may be partially made as a cooling jacket.

As mentioned above, according to the method and the apparatus for fabricating a III-V nitride film, since the inner wall of the reactor to which raw material gases are directly contacted is directly cooled down, the reaction between the raw material gases can be prevented on the inner wall. Therefore, the film-forming efficiency can be developed and thus, the film growth rate can be developed, particularly in fabricating an AlN film or an Al-rich Al$_x$Ga$_y$In$_z$N (x+y+z=1, x>0.5, y≧0, Z≧0) film using a large amount of trimethylaluminum and a large amount of ammonia. In addition, since the opposite portion of the inner wall of the reactor to the substrate is cooled down, the deposition and the breakaway of aluminum nitrides on and from the inner wall can be inhibited, and thus, the crystal quality of a III-V nitride film can be developed.

Moreover, since the reactor is made of quartz and the cooling jacket is made of stainless steel, the configuration of the apparatus can be simplified, and the cost of the apparatus can be lowered. Then, the fabricating cost of the III-V nitride film can be reduced due to the easy maintenance.

What is claimed is:

1. A method for fabricating a III-V nitride film, comprising the steps of:

providing a horizontal reactor;

setting a substrate onto a susceptor installed in the reactor;

heating the substrate to a predetermined temperature;

directly cooling at least a portion of the inner wall of the reactor directly opposite to the substrate; and introducing a raw III material gas and a raw V material gas with a carrier gas onto the substrate to form a III-V nitride film using a MOCVD method.

2. A fabricating method as defined in claim 1, wherein the susceptor is set on the bottom wall of the reactor, and a portion of the top wall of the reactor opposite to the substrate set on the susceptor is cooled down.

3. A fabricating method as defined in claim 1, wherein an upper stream side of the reactor with respect to the substrate set on the susceptor is cooled down.

4. A fabricating method as defined in claim 1, wherein the whole of the reactor is cooled down.

5. A fabricating method as defined in claim 1, wherein the III-V nitride film is an Al-rich Al$_x$Ga$_y$In$_z$N (x+y+z=1, x>0.5, y≧0, Z≧0) film.

6. A fabricating method as defined in claim 1, wherein the III-V nitride film is an AlN film.

* * * * *